(12) United States Patent
Choi et al.

(10) Patent No.: US 12,237,455 B2
(45) Date of Patent: Feb. 25, 2025

(54) ELECTROLUMINESCENCE DISPLAY APPARATUS INCLUDING PIXEL SENSING CIRCUIT

(71) Applicant: LG DISPLAY CO., LTD., Seoul (KR)

(72) Inventors: Ji Su Choi, Seoul (KR); Myung Gi Lim, Ansan-si (KR); Byung Jae Lee, Seoul (KR); Jung Heo, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 591 days.

(21) Appl. No.: 17/548,046

(22) Filed: Dec. 10, 2021

(65) Prior Publication Data

US 2022/0199876 A1 Jun. 23, 2022

(30) Foreign Application Priority Data

Dec. 17, 2020 (KR) .......................... 10-2020-0177267

(51) Int. Cl.
*G09G 3/32* (2016.01)
*H01L 27/15* (2006.01)
*H01L 33/62* (2010.01)

(52) U.S. Cl.
CPC ............... *H01L 33/62* (2013.01); *G09G 3/32* (2013.01); *H01L 27/156* (2013.01); *G09G 2310/0291* (2013.01); *G09G 2310/061* (2013.01)

(58) Field of Classification Search
None
See application file for complete search history.

(56) References Cited

U.S. PATENT DOCUMENTS

| 2018/0061329 | A1 | 3/2018 | Lee et al. |
| 2018/0122364 | A1 | 5/2018 | Lim et al. |
| 2020/0175919 | A1 | 6/2020 | Hong et al. |

FOREIGN PATENT DOCUMENTS

| CN | 108022557 A | 5/2018 |
| CN | 111243507 A | 6/2020 |

(Continued)

OTHER PUBLICATIONS

KR20170080775A Espacenet translation (Year: 2017).*
Office Action issued on Dec. 15, 2023 in Chinese Patent Application No. 202111484273.4 with English translation.

*Primary Examiner* — Amr A Awad
*Assistant Examiner* — Donna V Bocar
(74) *Attorney, Agent, or Firm* — Morgan, Lewis & Bockius LLP

(57) ABSTRACT

An electroluminescence display apparatus includes a pixel and a sensing circuit supplying a pixel reference voltage to the pixel through a reference voltage line during display driving and sensing a pixel current, flowing in the pixel, through the reference voltage line during sensing driving succeeding the display driving operation. The sensing circuit includes a sensing channel terminal connected to the reference voltage line, a first switch between the sensing channel terminal and an input terminal for the pixel reference voltage, an integrator amplifier including a first input terminal, a second input terminal, and an output terminal, an input terminal for an integrator reference voltage connected to the second input terminal, a second switch between the first input terminal and the output terminal, a first capacitor between the sensing channel terminal and the first input terminal, and a second capacitor between the sensing channel terminal and the output terminal.

10 Claims, 13 Drawing Sheets

(56) References Cited

FOREIGN PATENT DOCUMENTS

| CN | 111899691 A | 11/2020 |
|---|---|---|
| KR | 10-2017-0080775 A | 7/2017 |
| KR | 10-2018-0023188 A | 3/2018 |

\* cited by examiner

ELECTROLUMINESCENCE DISPLAY APPARATUS INCLUDING PIXEL SENSING CIRCUIT

CROSS-REFERENCE TO RELATED APPLICATIONS

This application claims the benefit of the Korean Patent Application No. 10-2020-0177267 filed on Dec. 17, 2020, which is hereby incorporated by reference as if fully set forth herein.

BACKGROUND

Technical Field

The present disclosure relates to an electroluminescence display apparatus.

Discussion of the Related Art

In electroluminescence display apparatuses having an active matrix type, a plurality of pixels each including a light emitting device and a driving element are arranged as a matrix type, and the luminance of an image implemented by the pixels is adjusted based on a gray level of image data. The driving element controls a pixel current flowing in the light emitting device on the basis of a voltage (hereinafter referred to as a gate-source voltage) applied between a gate electrode and a source electrode thereof. The amount of light emitted by the light emitting device and the luminance of a screen are determined based on a pixel current.

A threshold voltage and electron mobility of the driving element and an operating point voltage (or a turn-on voltage) of the light emitting device determine a driving characteristic of a pixel and thus should be constant in all pixels, but a driving characteristic between pixels may be changed by various causes such as a process characteristic and a degradation characteristic. Such a driving characteristic difference causes a luminance deviation, and due to this, there is a limitation in implementing an image.

Compensation technology for compensating for a luminance deviation between pixels has been proposed, but is not high in compensation performance because sensing performance is low.

SUMMARY

Accordingly, embodiments of the present disclosure are directed to an electroluminescence display apparatus that substantially obviates one or more of the problems due to limitations and disadvantages of the related art.

An aspect of the present disclosure is to provide an electroluminescence display apparatus having increased sensing performance.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, an electroluminescence display apparatus comprises a pixel and a sensing circuit supplying a pixel reference voltage to the pixel through a reference voltage line in a display driving operation and sensing a pixel current, flowing in the pixel, through the reference voltage line in a sensing driving operation succeeding the display driving operation, wherein the sensing circuit includes a sensing channel terminal connected to the reference voltage line, a first switch connected between the sensing channel terminal and an input terminal for the pixel reference voltage, an integrator amplifier including a first input terminal, a second input terminal, and an output terminal, an input terminal for an integrator reference voltage connected to the second input terminal, a second switch connected between the first input terminal and the output terminal, a first capacitor connected between the sensing channel terminal and the first input terminal, and a second capacitor connected between the sensing channel terminal and the output terminal.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles of the disclosure. In the drawings.

DETAILED DESCRIPTION OF THE DISCLOSURE

Figure 1:
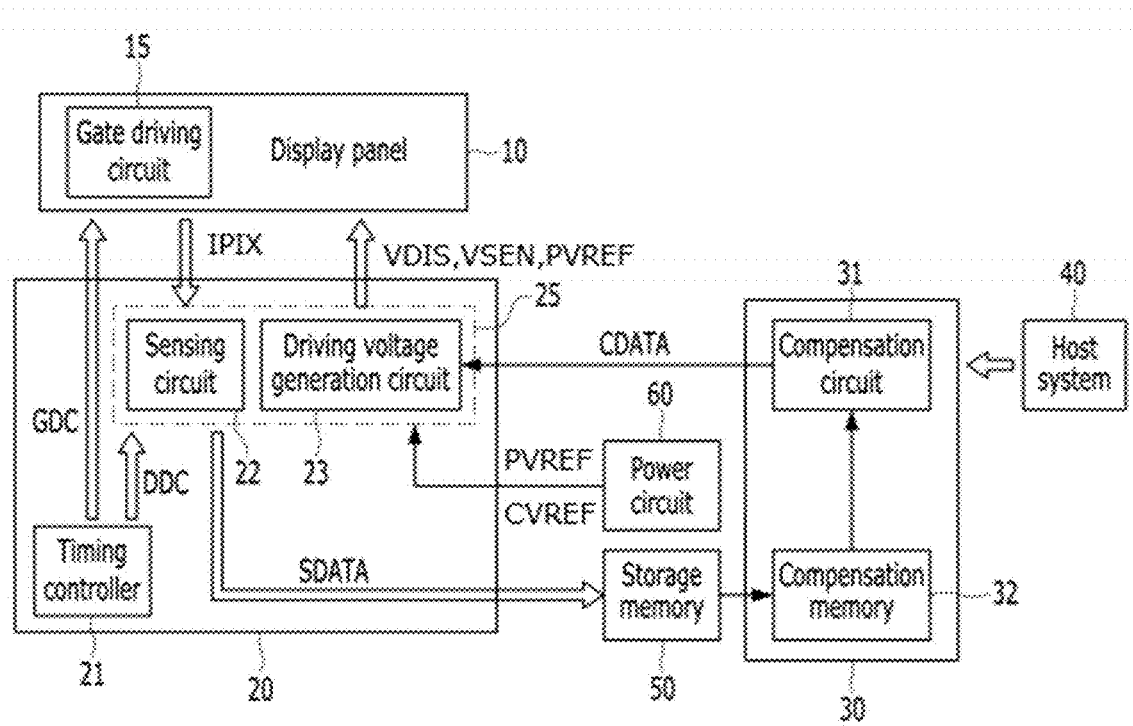
FIG. 1 is a diagram illustrating an electroluminescence display apparatus according to an embodiment of the present disclosure.

Hereinafter, the present disclosure will be described with reference to the accompanying drawings, in which example embodiments of the disclosure are shown. The disclosure may, however, be embodied in many different forms and should not be construed as being limited to the embodiments set forth herein; rather, these embodiments are provided so that this disclosure will be thorough and complete, and will fully convey the concept of the disclosure to those skilled in the art.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

The shapes, sizes, ratios, angles, numbers and the like disclosed in the drawings for description of various embodiments of the present disclosure to describe embodiments of the present disclosure are merely exemplary and the present disclosure is not limited thereto. Like reference numerals refer to like elements throughout. Throughout this specification, the same elements are denoted by the same reference numerals. As used herein, the terms "comprise", "having," "including" and the like suggest that other parts can be added unless the term "only" is used. As used herein, the singular forms "a", "an", and "the" are intended to include the plural forms as well, unless context clearly indicates otherwise.

Elements in various embodiments of the present disclosure are to be interpreted as including margins of error even without explicit statements.

In describing a position relationship, for example, when a position relation between two parts is described as "on~", "over~", "under~", and "next~", one or more other parts may be disposed between the two parts unless "just" or "direct" is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Like reference numerals refer to like elements throughout.

In the specification, a pixel circuit provided on a substrate of a display panel may be implemented with a thin film transistor (TFT) having an n-type metal oxide semiconductor field effect transistor (MOSFET) structure, but is not limited thereto and may be implemented with a TFT having a p-type MOSFET structure. A TFT may be a three-electrode element which includes a gate, a source, and a drain. The source may be an electrode which supplies a carrier to a transistor. In the TFT, a carrier may start to flow from the source. The drain may be an electrode which enables the carrier to flow out from the TFT. That is, in a MOSFET, the carrier flows from the source to the drain. In the n-type TFT (NMOS), because a carrier is an electron, a source voltage may have a lower voltage than a drain voltage so that the electron flows from the source to the drain. In the n-type TFT, because the electron flows from the source to the drain, a current may flow from the drain to the source. On the other hand, in the p-type TFT (PMOS), because a carrier is a hole, a source voltage may be higher than a drain voltage so that the hole flows from the source to the drain. In the p-type TFT, because the hole flows from the source to the drain, a current may flow from the source to the drain. It should be noted that a source and a drain of a MOSFET are not fixed but switch therebetween. For example, the source and the drain of the MOSFET may switch therebetween.

Moreover, in the present disclosure, a semiconductor layer of a TFT may be implemented with at least one of an oxide element, an amorphous silicon element, and a polysilicon element.

In the following description, when the detailed description of the relevant known function or configuration is determined to unnecessarily obscure the important point of the present disclosure, the detailed description will be omitted. Hereinafter, embodiments of the present disclosure will be described in detail with reference to the accompanying drawings.

Figure 2:
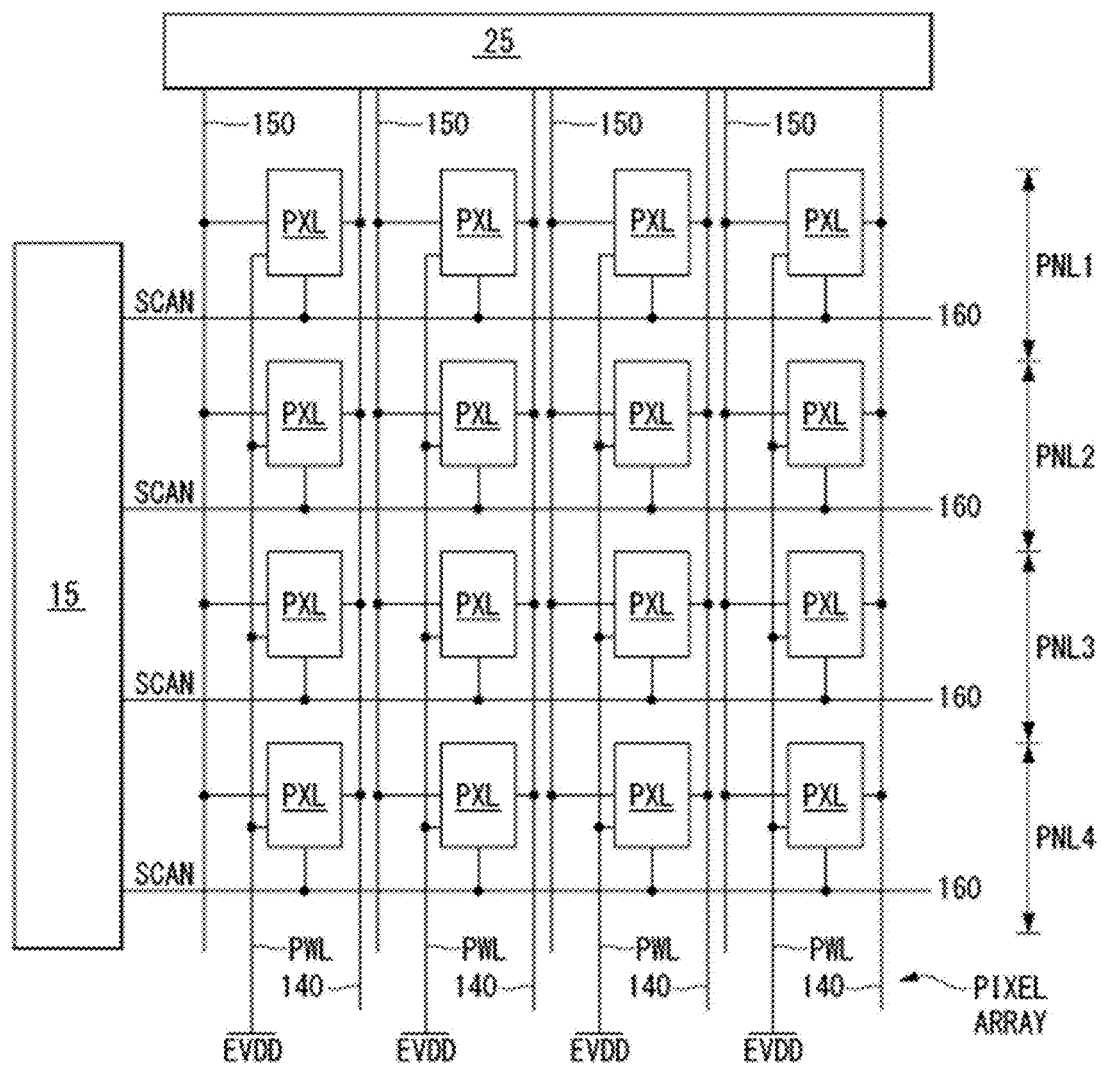
FIG. 2 is a diagram illustrating an example of a pixel array included in a display panel of FIG. 1.

FIG. 1 is a diagram illustrating an electroluminescence display apparatus according to an embodiment of the present disclosure. FIG. 2 is a diagram illustrating an example of a pixel array included in a display panel of FIG. 1.

Referring to FIGS. 1 and 2, the electroluminescence display apparatus according to an embodiment of the present disclosure may include a display panel 10, a driver integrated circuit (IC) 20, a compensation IC 30, a host system 40, a storage memory 50, and a power circuit 60. A panel driving circuit for driving the display panel 10 may include a gate driving circuit 15 included in the display panel 10 and a data driving circuit 25 embedded into the driver IC 20.

The display panel 10 may include a plurality of pixel lines PNL1 to PNL4, and each of the pixel lines PNL1 to PNL4 may include a plurality of pixels PXL and a plurality of signal lines. A "pixel line" described herein may not be a physical signal line and may denote a set of signal lines and pixels PXL adjacent to one another in an extension direction of a gate line. The signal lines may include a plurality of data lines 140 for supplying a display data voltage VDIS and a sensing data voltage VSEN, a plurality of reference voltage lines 150 for supplying a pixel reference voltage PVREF to the pixels PXL, a plurality of gate lines 160 for supplying a gate signal to the pixels PXL, and a plurality of high level power lines PWL for supplying a high level pixel voltage to the pixels PXL.

The pixel PXL of the display panel 10 may be arranged as a matrix type to configure a pixel array. Each pixel PXL included in the pixel array of FIG. 2 may be connected to one of the data lines 140, one of the reference voltage lines 150, one of the high level power lines PWL, and one of the gate lines 160. Each pixel PXL included in the pixel array of FIG. 2 may be connected to the plurality of gate lines 160. Also, each pixel PXL included in the pixel array of FIG. 2 may be further supplied with a low level pixel voltage from the power circuit 60. The power circuit 60 may supply a low level pixel voltage to a pixel PXL through a low level power line or a pad part.

The gate driving circuit 15 may be embedded into the display panel 10. The gate driving circuit 15 may be disposed in a non-display area outside a display area where the pixel array is provided.

The gate driving circuit 15 may include a plurality of gate stages connected to the gate lines 160 of the pixel array. The gate stages may generate the gate signal for controlling switch elements of the pixels PXL and may supply the gate signal to the gate lines 160.

The driver IC 20 may include a timing controller 21 and the data driving circuit 25, but is not limited thereto. The timing controller 21 may not be included in the driver IC 20 and may be mounted on a control board along with the driver IC 20. The data driving circuit 25 may include a sensing circuit 22 and a driving voltage generating circuit 23.

The timing controller 21 may generate a gate timing control signal GDC for controlling an operating timing of the gate driving circuit 15 and a data timing control signal DDC for controlling an operating timing of the data driving circuit 25 with reference to timing signals (for example, a vertical synchronization signal Vsync, a horizontal synchronization signal Hsync, a dot clock signal DCLK, and a data enable signal DE) input from a host system 40.

The data timing control signal DDC may include a source start pulse, a source sampling clock, and a source output enable signal, but is not limited thereto. The source start pulse may control a data sampling start timing of the driving voltage generating circuit 23. The source sampling clock may be a clock signal for controlling a sampling timing of data with respect to a rising or falling edge. The source output enable signal may control an output timing of the driving voltage generating circuit 23.

The gate timing control signal GDC may include a gate start signal and a gate shift clock, but is not limited thereto. The gate start pulse may be applied to a gate stage which generates a first gate output and may activate an operation of the gate stage. The gate shift clock may be input to the gate stages in common and may be a clock signal for shifting the gate shift pulse.

The timing controller 21 may control an operating timing of the panel driving circuit, and thus, may sense a driving characteristic of the pixels PXL in real-time driving (for example, in a vertical blank period of each frame). Here, the vertical blank period may be a period which is disposed between adjacent vertical active periods and where the applying of the image data stops. The vertical active period may be a period where image data is applied to the display panel 10 so as to reproduce an image. A driving characteristic of the pixels PXL may include one or more of a threshold voltage and electron mobility of the driving element included in each pixel PXL and an operating point voltage of the light emitting device included in each pixel PXL.

The timing controller 21 may control a sensing driving timing and a display driving timing of the pixel lines PNL1 to PNL4 of the display panel 10 on the basis of a predetermined sequence, and thus, may implement a display driving operation and a sensing driving operation.

The timing controller 21 may differently generate timing control signals GDC and DDC for the display driving operation and timing control signals GDC and DDC for the sensing driving operation. The sensing driving operation may denote an operation which applies the sensing data voltage VSEN to pixels PXL included a sensing target pixel line to sense a driving characteristic of corresponding pixels PXL and updates a compensation value for compensating for a driving characteristic variation of the corresponding pixels PXL on the basis of sensing result data SDATA. Also, the display driving operation may denote an operation which corrects digital image data, which is to be input to corresponding pixels PXL, on the basis of an updated compensation value and applies the display data voltage VDIS corresponding to corrected image data CDATA to the corresponding pixels PXL to display an input image.

The driving voltage generating circuit 23 may be implemented as a digital-to-analog converter (DAC) which converts a digital signal into an analog signal. The driving voltage generating circuit 23 may generate the sensing data voltage VSEN needed for the sensing driving operation and the display data voltage VDIS needed for the display driving operation and supplies the sensing data voltage VSEN and the display data voltage VDIS to the data lines 140. The display data voltage VDIS may be a digital-to-analog conversion result of the corrected digital image data CDATA obtained through correction by the compensation IC 30 and may have a level which varies by pixel units on the basis of a grayscale value and a compensation value. The sensing data voltage VSEN may be differently set in red (R), green (G), blue (B), and white (W) pixels on the basis of that a driving characteristic of the driving element differs for each color.

The sensing circuit 22 may sense the driving characteristic of the pixels PXL through a plurality of sensing channels, for the sensing driving operation. The sensing channels may be connected to the pixels PXL through the sensing lines. In an embodiment of the present disclosure, the sensing lines may be implemented as the reference voltage lines 150. The sensing circuit 22 may be implemented as a current sensing type which senses a pixel current flowing in each pixel PXL. The sensing circuit 22 may have a structure suitable for enhancing sensing performance as in FIGS. 5 and 8. The sensing circuit 22 may simultaneously perform a parallel processing operation on a plurality of analog sensing values by using a plurality of analog-to-digital converters (ADCs) and may sequentially perform a serial processing operation on the plurality of analog sensing values by using one ADC. The ADC may convert the analog sensing values into the digital sensing result data SDATA on the basis of a predetermined sensing range, and then, may store the digital sensing result data SDATA in the storage memory 50.

The storage memory 50 may store digital sensing result data SDATA input from the sensing circuit 22 in performing the sensing driving operation. The storage memory 50 may be implemented as flash memory, but is not limited thereto.

The compensation IC 30 may include a compensation circuit 31 and a compensation memory 32. The compensation memory 32 may transfer the digital sensing result data SDATA, read from the storage memory 50, to the compensation circuit 31. The compensation memory 32 may be random access memory (RAM) (for example, double data rate synchronous dynamic RAM (DDR SDRAM), but is not limited thereto. The compensation circuit 31 may calculate a compensation offset and a compensation gain for each pixel on the basis of the digital sensing result data SDATA read from the storage memory 50, correct image data input from the host system 40 on the basis of the calculated compensation offset and compensation gain, and supply the corrected image data CDATA to the driver IC 20.

The power circuit 60 may generate a pixel reference voltage PVREF and an integrator reference voltage CVREF and may supply the pixel reference voltage PVREF and the integrator reference voltage CVREF to the driver IC 20. A voltage level of the pixel reference voltage PVREF may be previously set based on a voltage output range of the driving voltage generating circuit 23, and the integrator reference voltage CVREF may be previously set based on an output range of an ADC. Considering driving stability and sensing performance, the integrator reference voltage CVREF may be set to be higher than the pixel reference voltage PVREF. The pixel reference voltage PVREF may be supplied to the pixels PXL of the display panel 10 through the sensing circuit 22 and the reference voltage lines 150. The integrator reference voltage CVREF may be supplied to the sensing circuit 22.

Figure 3:
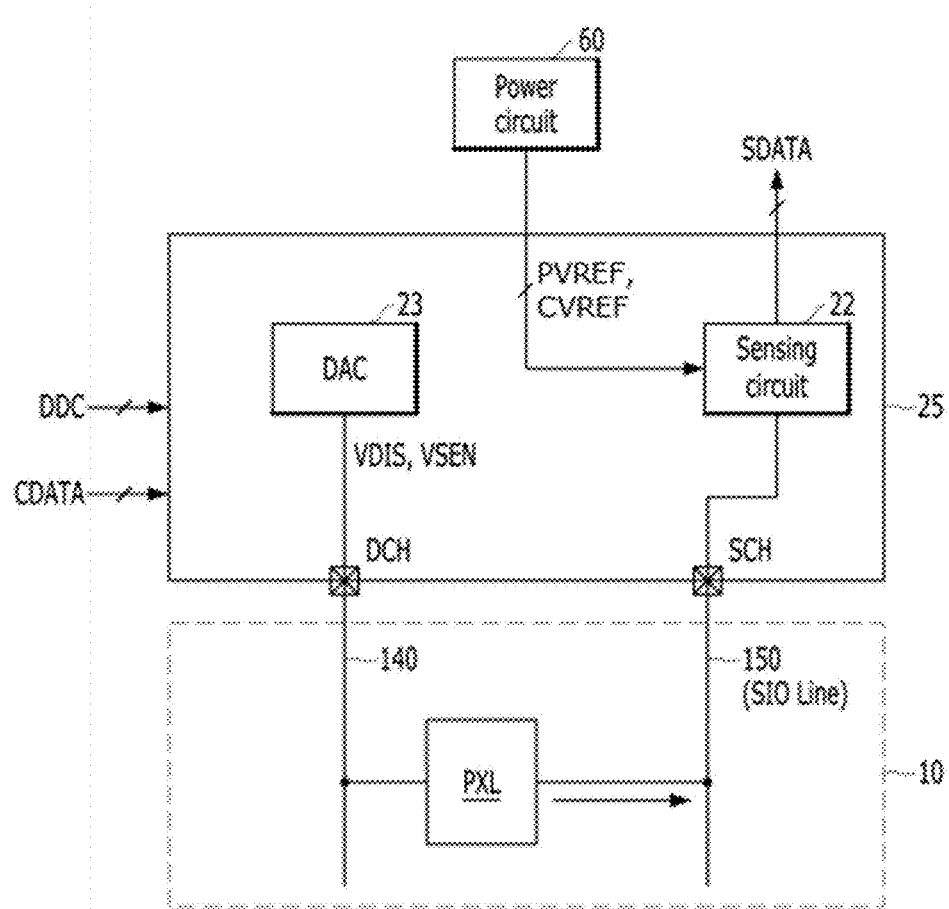
FIG. 3 is a diagram illustrating a configuration of a data driver connected to the pixel array of FIG. 2.

FIG. 3 is a diagram illustrating a configuration of the data driving circuit 25 connected to the pixel array of FIG. 2. In FIG. 3, each of the reference voltage lines 150 may be connected to a sensing channel terminal SCH of the data driving circuit 25 and may perform a function of the sensing line.

Referring to FIG. 3, the data driving circuit 25 may be connected to a first node of the pixel PXL (connected to a gate electrode of the driving element) through the data line 140 and may be connected to a second node of the pixel PXL (connected to a source electrode of the driving element) through the reference voltage line 150. An on current or an off current may flow in the second node of the pixel PXL, and thus, the reference voltage line 150 connected to the second node through a second switch element may act as a sensing line.

The data driving circuit 25 may include the driving voltage generating circuit 23 and the sensing circuit 22. The driving voltage generating circuit 23 may be connected to the data line 140 of the display panel 10 through a data channel DCH, and the sensing circuit 22 may be connected to the reference voltage line 150 of the display panel 10 through a sensing channel terminal SCH. The driving voltage generating circuit 23 may generate the sensing data voltage VSEN and the display data voltage VDIS by using the DAC. The sensing data voltage VSEN may include an on voltage and an off voltage. The on voltage may be a voltage for turning on the driving element of the pixel PXL, and the off voltage may be a voltage for turning off the driving element of the pixel PXL. The off voltage may be a voltage close to a black gray level.

The sensing channel terminal SCH may supply the pixel reference voltage PVREF to the reference voltage line 150 in performing the display driving operation. Also, in the sensing driving operation succeeding the display driving operation, the sensing channel terminal SCH may enable the reference voltage line 150 to maintain the pixel reference voltage PVREF. The sensing channel terminal SCH may be a current path which transfers the pixel current, applied through the reference voltage line 150, to the sensing circuit 22 in a sensing period of the sensing driving operation.

The sensing driving operation may be performed in the vertical blank period. A length of the vertical blank period may be reduced as a resolution of the display panel increases and a frame frequency is higher. In an embodiment of the present disclosure, an additional voltage initialization operation performed on the reference voltage line 150 may be omitted so that a sufficient current sensing time is secured in sensing driving in a high-resolution and high-speed driving model. That is, in an embodiment of the present disclosure, a voltage of the reference voltage line 150 may not be changed from the pixel reference voltage PVREF to the integrator reference voltage CVREF. In an embodiment of the present disclosure, the display driving operation and the sensing driving operation may be continuously implemented in a state where the reference voltage line 150 maintains the pixel reference voltage PVREF. Therefore, in the embodiments of the present disclosure, in performing the sensing driving operation, a time (a time for changing a voltage to PVREF_CVREF) taken in initializing a voltage of the reference voltage line may be omitted, and a current sensing time may be sufficiently secured in a limited vertical blank period, thereby increasing sensing performance.

Figure 4:
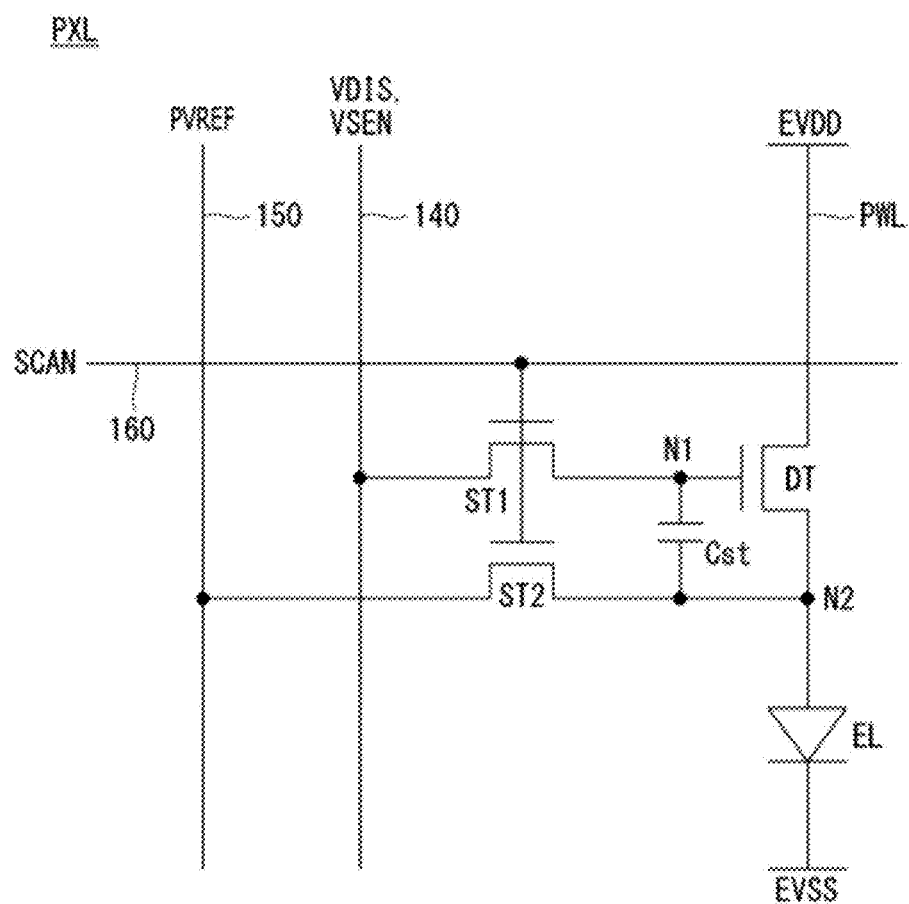
FIG. 4 is an equivalent circuit diagram of a pixel illustrated in FIG. 3.

FIG. 4 is an equivalent circuit diagram of the pixel illustrated in FIG. 3 and illustrates one pixel PXL which uses the reference voltage line 150 as a sensing line.

Referring to FIG. 4, the one pixel PXL may include a light emitting device EL, a driving thin film transistor (TFT) DT, a plurality of switch TFTs ST1 and ST2, and a storage capacitor Cst. The driving TFT DT and the switch TFTs ST1 and ST2 may each be implemented as an NMOS transistor, but are not limited thereto.

The light emitting device EL may emit light with a pixel current supplied from the driving TFT DT. The light emitting device EL may be implemented as an organic light emitting diode including an organic light emitting layer, or may be implemented as an inorganic light emitting diode including an inorganic light emitting layer. An anode electrode of the light emitting device EL may be connected to a second node N2, and a cathode electrode thereof may be connected to an input terminal of a low level pixel voltage EVSS.

The driving TFT DT may be a driving element which generates a pixel current on the basis of a gate-source voltage. A gate electrode of the driving TFT DT may be connected to a first node N1, a first electrode thereof may be connected to an input terminal of a high level pixel voltage EVDD through a high level power line PWL, and a second electrode thereof may be connected to the second node N2.

The switch TFTs (for example, first and second TFTs) ST1 and ST2 may be switch elements which set the gate-source voltage of the driving TFT DT and connect the first electrode of the driving TFT DT to a data line 140 or connect the second electrode of the driving TFT DT to a reference voltage line 150. The switch TFTs ST1 and ST2 may be turned on based on the same gate signal SCAN.

The first switch TFT ST1 may be connected between the data line 140 and the first node N1 and may be turned on based on the gate signal SCAN transferred through a gate line 160. The first switch TFT ST1 may be turned on in programming for the display driving operation and may be turned on in an initialization period for the sensing driving operation. When the first switch TFT ST1 is turned on, a sensing data voltage VSEN or a display data voltage VDIS may be applied to the first node Ni. A gate electrode of the first switch TFT ST1 may be connected to the gate line 160, a first electrode thereof may be connected to the data line 140, and a second electrode thereof may be connected to the first node Ni.

The second switch TFT ST2 may be connected between the reference voltage line 150 and the second node N2 and may be turned on based on the gate signal SCAN transferred through the gate line 160. The second switch TFT ST2 may be turned on in programming for the display driving operation and may apply a pixel reference voltage PVREF to the second node N2. The second switch TFT ST2 may be turned on in the sensing driving operation and may transfer a pixel current, which is to be sensed, to the reference voltage line 150. A gate electrode of the second switch TFT ST2 may be connected to the gate line 160, a first electrode thereof may be connected to the reference voltage line 150, and a second electrode thereof may be connected to the second node N2.

The storage capacitor Cst may be connected between the first node N1 and the second node N2 and may maintain a gate-source voltage of the driving TFT DT during a certain period.

First Embodiment

Figure 5:
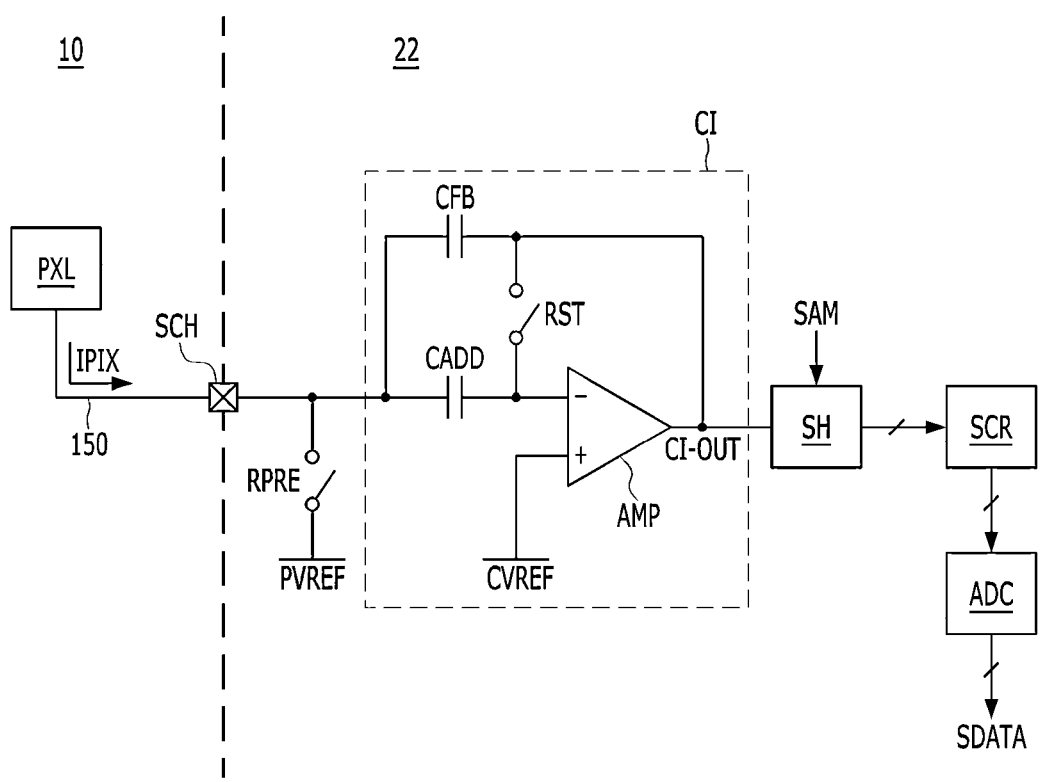
FIG. 5 is a diagram illustrating an example of a sensing circuit connected to one pixel of a display panel.

FIG. 5 is a diagram illustrating an example of a sensing circuit connected to one pixel of a display panel Referring to FIG. 5, in performing the display driving operation, the sensing circuit 22 may supply the pixel reference voltage PVREF to a pixel PXL through the reference voltage line 150, and in performing the sensing driving operation succeeding the display driving operation, the sensing circuit 22 may sense a pixel current IPIX, flowing in the pixel PXL, through the reference voltage line 150.

The sensing circuit 22 may include a sensing channel terminal SCH connected to the reference voltage line 150, a switch RPRE connected between the sensing channel terminal SCH and an input terminal for the pixel reference voltage PVREF, a current integrator CI which senses the pixel current IPIX input through the sensing channel terminal SCH, a sampling circuit SH which samples an output CI-OUT of the current integrator CI, a scaler SCR which shifts an output level of the sampling circuit SH, and an ADC which converts an analog output of the scaler SCR into a digital signal to generate sensing result data SDATA.

The current integrator CI may include an integrator amplifier AMP, a switch RST, a capacitor CFB, and a capacitor CADD. The integrator amplifier AMP may include a (+) input terminal connected to an input terminal for the integrator reference voltage CVREF, a (−) input terminal connected to the switch RST and the capacitor CADD, and an output terminal connected to the sampling circuit SH. The switch RST may be connected between the (+) input terminal and the output terminal. The capacitor CADD may be connected between the sensing channel terminal SCH and the (−) input terminal. The capacitor CFB may be connected between the sensing channel terminal SCH and the output terminal.

The display driving operation may be performed in the vertical active period, and the sensing driving operation may be performed in the vertical blank period succeeding the vertical active period. In performing the display driving operation, the pixel reference voltage PVREF may be charged into the reference voltage line 150. In performing the sensing driving operation, the sensing circuit 22 may connect the reference voltage line 150 to the input terminal for the pixel reference voltage PVREF before sensing the pixel current IPIX, and thus, a time taken in initializing a voltage of the reference voltage line 150 may be omitted. In this case, the capacitor CADD included in the sensing circuit 22 may sample and store a difference between the integrator reference voltage CVREF and the pixel reference voltage PVREF. When the capacitor CADD is not provided, the integrator reference voltage CVREF and the pixel reference voltage PVREF may not be separated from each other in a reset period XY1 of FIG. 6, and thus, the technical spirit of the present disclosure may not be implemented.

Because the sensing circuit 22 includes the switch RPRE and the capacitor CADD, a time (a time for changing a voltage to PVREF_CVREF) taken in initializing a voltage of the reference voltage line may be omitted in performing the sensing driving operation, and a current sensing time may be sufficiently secured in a limited vertical blank period, thereby increasing sensing performance.

Figure 6:
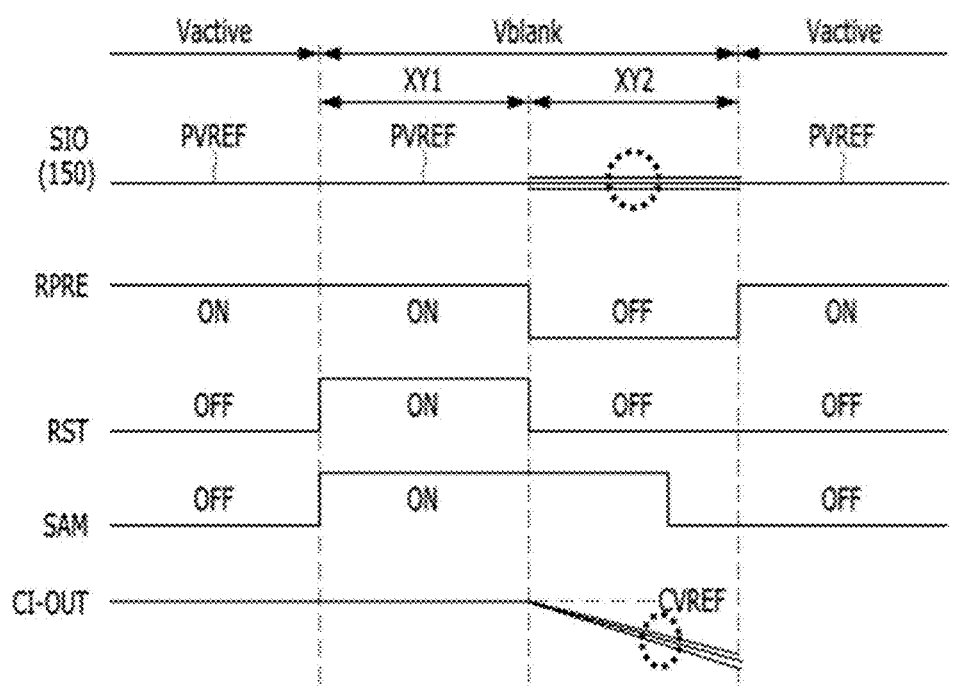
FIG. 6 is a diagram showing an operating timing of the sensing circuit of FIG. 5.

FIG. 6 is a diagram showing an operating timing of the sensing circuit 22 of FIG. 5.

Referring to FIG. 6, a vertical blank period Vblank where the sensing driving operation is performed may include a reset period XY1 and a sensing period XY2 succeeding the reset period XY1. The display driving operation may be performed in a vertical active period Vactive preceding the vertical blank period Vblank.

In the reset period XY1, the switch RPRE may maintain an on state in performing the display driving operation, and the switch RST may be inverted from an off state to an on state. In the reset period XY1, the integrator output voltage CI-OUT output through an output terminal of the integrator amplifier AMP may be the integrator reference voltage CVREF. At this time, it is not needed that a voltage SIO of the reference voltage line 150 is changed from the pixel reference voltage PVREF to the integrator reference voltage CVREF, and thus, the reset period XY1 may be allocated to be short in the vertical blank period Vblank. In the reset period XY1, a voltage at both ends of the capacitor CADD may be sampled so that a noise component of each of the pixel reference voltage PVREF and the integrator reference voltage CVREF is added thereto.

In the sensing period XY2, the switch RPRE and the switch RST may be inverted from an on state to an off state, and the integrator output voltage CI-OUT output through the output terminal of the integrator amplifier AMP may be lowered from the integrator reference voltage CVREF as the pixel current IPIX is accumulated into the capacitor CFB. The integrator output voltage CI-OUT may be sampled by the sampling circuit SH while the sampling signal SAM is enabled (on). In the vertical blank period Vblank, because a time occupied by the reset period XY1 is short, the sensing period XY2 may be allocated to be relatively long. When the sensing period XY2 may be allocated to be long, multi-sensing may be possible, and thus, sensing performance may be easily enhanced.

Figure 7A:
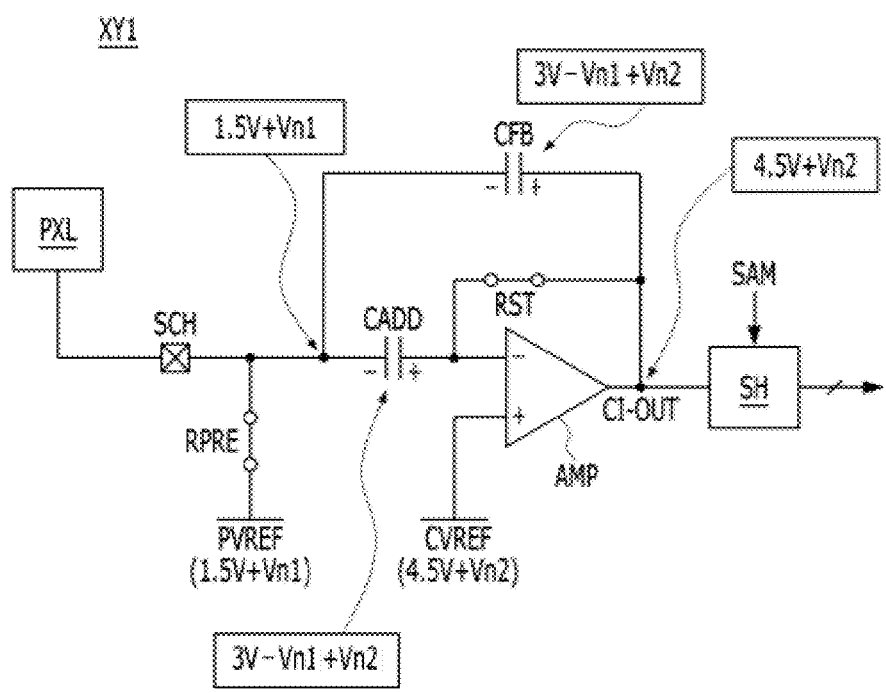
FIG. 7A is a diagram showing an operating state of a sensing circuit in a reset period of FIG. 6.
Figure 7B:
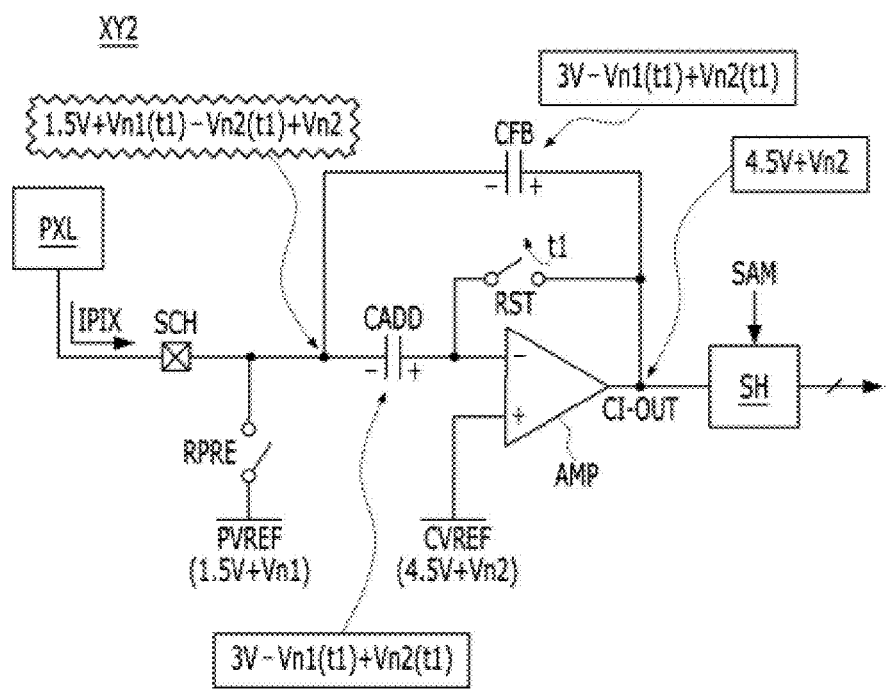
FIG. 7B is a diagram showing an operating state of a sensing circuit in a sensing period of FIG. 6.

FIG. 7A is a diagram showing an operating state of the sensing circuit 22 in the reset period XY1 of FIG. 6. FIG. 7B is a diagram showing an operating state of the sensing circuit 22 in the sensing period XY2 of FIG. 6. In FIGS. 7A and 7B, the pixel reference voltage PVREF is 1.5 V, and the integrator reference voltage CVREF is 4.5 V.

Referring to FIGS. 7A and 7B, the sensing circuit 22 according to an embodiment of the present disclosure may sufficiently secure a current sensing time, but a variation of the voltage SIO of the reference voltage line 150 caused by power noise is large. Here, the power noise may include a first noise voltage Vn1 occurring in the pixel reference voltage PVREF and a second noise voltage Vn2 occurring in the integrator reference voltage CVREF.

In the reset period XY1 of FIG. 7A, "1.5V+Vn1" is applied to the sensing channel terminal SCH and the reference voltage line 150, and "4.5V+Vn2" is applied to each of the (+) input terminal, the (−) input terminal, and the output terminal of the integrator amplifier AMP. Also, "3V−Vn1+Vn2" is stored in each of the capacitors CADD and CFB.

In the reset period XY2 of FIG. 7B, a voltage applied to the (−) input terminal of the integrator amplifier AMP may be the same as the reset period XY1. When the switch RST is turned off in this state, the voltage stored in each of the capacitors CADD and CFB is "3V−Vn1(t1)+Vn2(t1)". Also, when the switch RPRE is turned off, a voltage applied to the reference voltage line 150 is changed to "1.5V+Vn1(t1)−Vn2(t1)+Vn2". Here, "Vn1(t1)" is the first noise voltage Vn1 at a time at which the switch RST is turned off, and "Vn2(t1)" is the second noise voltage Vn2 at a time at which the switch RST is turned off The variation of the voltage SIO of the reference voltage line 150 is affected by the first noise voltage Vn1 and the second noise voltage Vn2. When the voltage SIO of the reference voltage line 150 is changed by the power noise, a pixel current may be distorted, and thus, the integrator output voltage CI-OUT may be shifted from "4.5V+Vn2" (see a dotted-line circle of FIG. 6).

Second Embodiment

Figure 8:
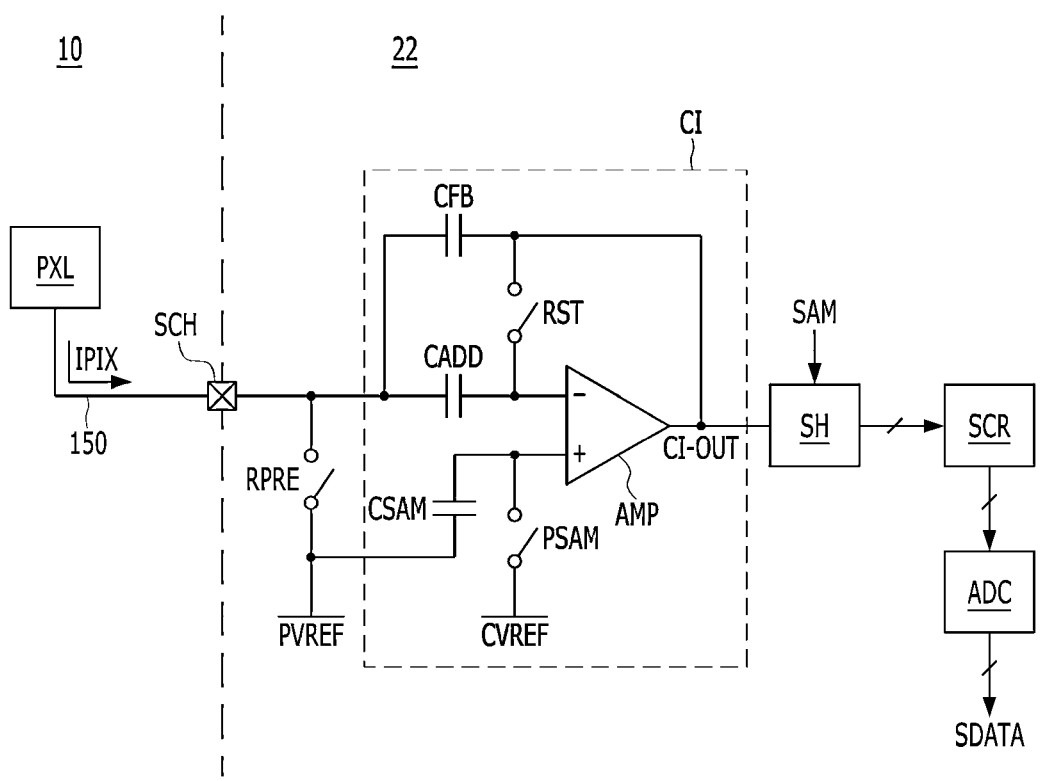
FIG. 8 is a diagram illustrating another example of a sensing circuit connected to one pixel of a display panel.

FIG. 8 is a diagram illustrating another example of a sensing circuit 22 connected to one pixel of a display panel. The sensing circuit 22 of FIG. 8 may further include a switch PSAM and a capacitor CSAM, and thus, may minimize an adverse effect of power noise described above.

Referring to FIG. 8, in performing the display driving operation, the sensing circuit 22 may supply a pixel reference voltage PVREF to a pixel PXL through a reference voltage line 150, and in performing the sensing driving operation succeeding the display driving operation, the sensing circuit 22 may sense a pixel current IPIX, flowing in the pixel PXL, through the reference voltage line 150.

The sensing circuit 22 may include a sensing channel terminal SCH connected to the reference voltage line 150, a switch RPRE connected between the sensing channel terminal SCH and an input terminal for the pixel reference voltage PVREF, a current integrator CI which senses the pixel current IPIX input through the sensing channel terminal SCH, a sampling circuit SH which samples an output CI-OUT of the current integrator CI, a scaler SCR which shifts an output level of the sampling circuit SH, and an ADC which converts an analog output of the scaler SCR into a digital signal to generate sensing result data SDATA.

The current integrator CI may include an integrator amplifier AMP, a switch RST, a capacitor CFB, and a capacitor CADD. The integrator amplifier AMP may include a (+) input terminal connected to an input terminal for the integrator reference voltage CVREF, a (−) input terminal connected to the switch RST and the capacitor CADD, and an output terminal connected to the sampling circuit SH. The switch RST may be connected between the (−) input terminal and the output terminal. The capacitor CADD may be connected between the sensing channel terminal SCH and the (−) input terminal. The capacitor CFB may be connected between the sensing channel terminal SCH and the output terminal.

Also, in order to minimize an adverse effect of power noise, the current integrator CI may further include a switch P SAM, connected between the (+) input terminal of the integrator amplifier AMP and the input terminal for the integrator reference voltage CVREF, and a capacitor CSAM connected between the (+) input terminal of the integrator amplifier AMP and the input terminal for the pixel reference voltage PVREF. The capacitor CSAM may be provided in the driver IC 20 with the sensing circuit 22 mounted thereon, or may be provided outside the driver IC 20. The capacitor CSAM may be provided in the non-display area of the display panel or on a control printed circuit board (not shown) connected to the driver IC 20. In this case, a mount area of the sensing circuit 22 may be reduced, and the manufacturing cost and a size of the driver IC 20 may be easily reduced.

The display driving operation may be performed in the vertical active period, and the sensing driving operation may be performed in the vertical blank period succeeding the vertical active period. In performing the display driving operation, the pixel reference voltage PVREF may be charged into the reference voltage line 150. In performing the sensing driving operation, the sensing circuit 22 may connect the reference voltage line 150 to the input terminal for the pixel reference voltage PVREF before sensing the pixel current IPIX, and thus, a time taken in initializing a voltage of the reference voltage line 150 may be omitted. In this case, the capacitor CADD included in the sensing circuit 22 may sample and store a difference between the integrator reference voltage CVREF and the pixel reference voltage PVREF. When the capacitor CADD is not provided, the integrator reference voltage CVREF and the pixel reference voltage PVREF may not be separated from each other in a reset period XY1 of FIG. 9, and thus, the technical spirit of the present disclosure may not be implemented.

Because the sensing circuit 22 includes the switch RPRE and the capacitor CADD, a time (a time for changing a voltage to PVREF_CVREF) taken in initializing a voltage of the reference voltage line may be omitted in performing the sensing driving operation, and a current sensing time may be sufficiently secured in a limited vertical blank period, thereby increasing sensing performance.

Moreover, the sensing circuit 22 may further include the switch PSAM and the capacitor CSAM, and thus, the number of noise sources may decrease from two to one. In other words, the sensing circuit 22 may sample a DC level of the pixel reference voltage PVREF and the integrator reference voltage CVREF by using the capacitor CSAM, and then, only a noise component of the pixel reference voltage PVREF may be sampled in sampling a voltage at both ends of the capacitor CSAM, thereby minimizing the distortion of the integrator output voltage CI-OUT and a variation of the voltage SIO of the reference voltage line 150 caused by power noise.

Figure 9:
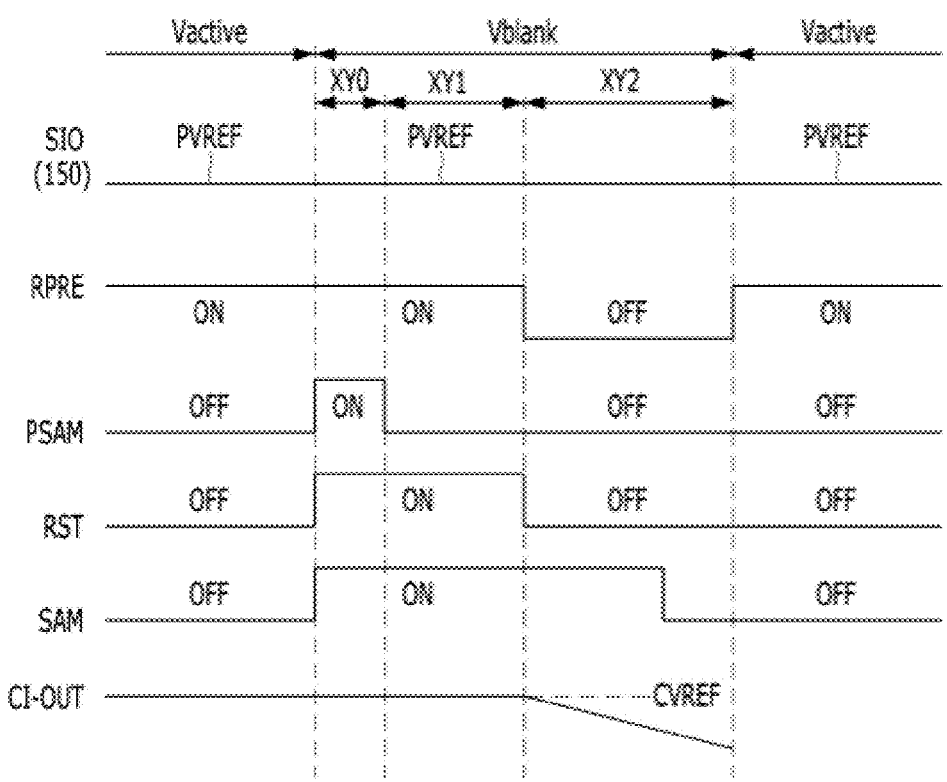
FIG. 9 is a diagram showing an operating timing of the sensing circuit of FIG. 8.

FIG. 9 is a diagram showing an operating timing of the sensing circuit 22 of FIG. 8.

Referring to FIG. 9, a vertical blank period Vblank where the sensing driving operation is performed may include a power sampling period XY0, a reset period XY1 succeeding the power sampling period XY0, and a sensing period XY2 succeeding the reset period XY1. The display driving operation may be performed in a vertical active period Vactive preceding the vertical blank period Vblank.

In the power sampling period XY0, the switch RPRE may maintain an on state in performing the display driving operation, and the switch RST and the switch PSAM may be inverted from an off state to an on state. Therefore, a DC level of the pixel reference voltage PVREF and the integrator reference voltage CVREF may be sampled by the capacitor CSAM. In the power sampling period XY0, the integrator output voltage CI-OUT output through an output terminal of the integrator amplifier AMP may be the integrator reference voltage CVREF. At this time, it is not needed that a voltage SIO of the reference voltage line 150 is changed from the pixel reference voltage PVREF to the integrator reference voltage CVREF, and thus, the power sampling period XY0 may be allocated to be short in the vertical blank period Vblank.

In the reset period XY1, the switch PSAM may be inverted from an on state to an off state, and the switch RST and the switch RPRE may maintain an on state. In the reset period XY1, a voltage at both ends of the capacitor CADD may be sampled so that a noise component of each of the pixel reference voltage PVREF is added thereto. Therefore, the distortion of the integrator output voltage CI-OUT and a variation of the voltage SIO of the reference voltage line 150 caused by power noise may be minimized. In the reset period XY1, the integrator output voltage CI-OUT output through an output terminal of the integrator amplifier AMP may be the integrator reference voltage CVREF. At this time, it is not needed that the voltage SIO of the reference voltage line 150 is changed from the pixel reference voltage PVREF to the integrator reference voltage CVREF, and thus, the reset period XY1 may be allocated to be short in the vertical blank period Vblank.

In the sensing period XY2, the switch RST and the switch RPRE may be inverted from an on state to an off state, the switch PSAM may maintain an off state, and the integrator output voltage CI-OUT output through the output terminal of the integrator amplifier AMP may be lowered from the integrator reference voltage CVREF as the pixel current IPIX is accumulated into the capacitor CFB. The integrator output voltage CI-OUT may be sampled by the sampling circuit SH while the sampling signal SAM is enabled (on). In the vertical blank period Vblank, because a time occupied by the power sampling period XY0 and the reset period XY1 is short, the sensing period XY2 may be allocated to be relatively long. When the sensing period XY2 may be allocated to be long, multi-sensing may be possible, and thus, sensing performance may be easily enhanced.

Figure 10A:
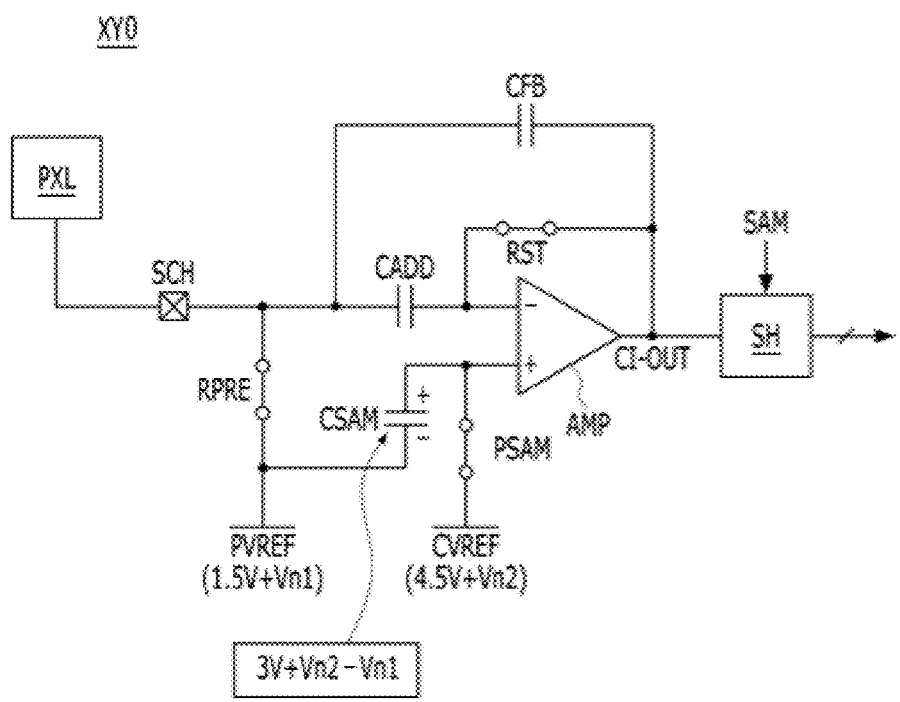
FIG. 10A is a diagram showing an operating state of a sensing circuit in a power sampling period of FIG. 9.
Figure 10B:
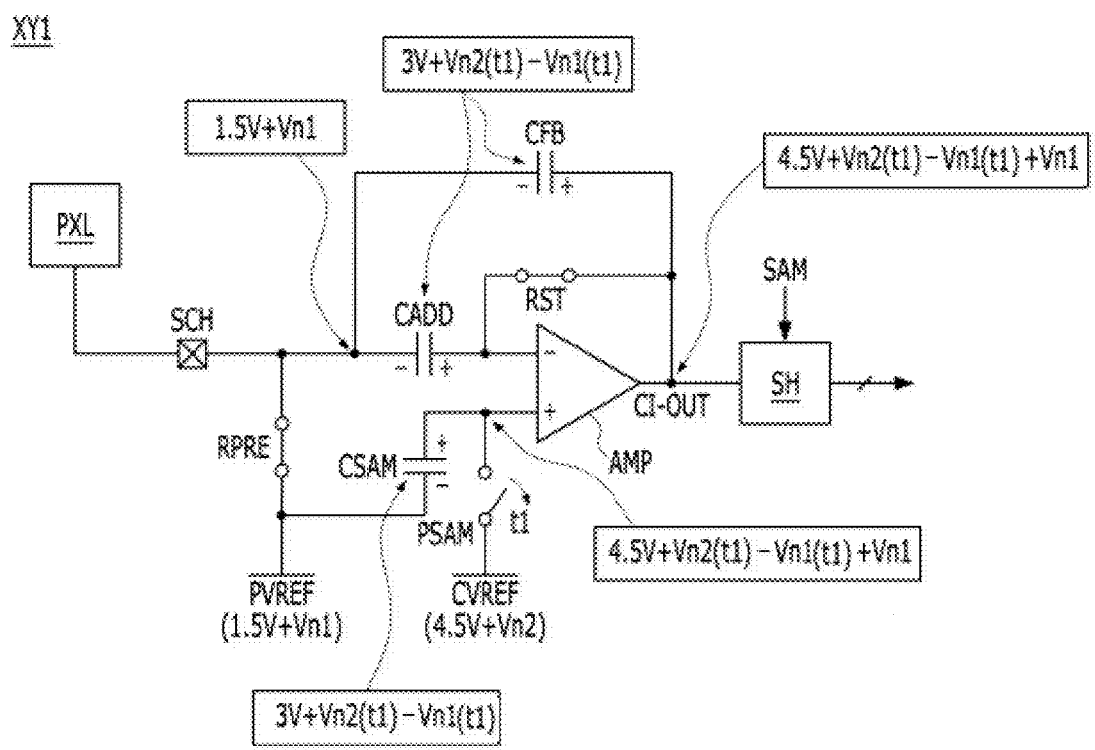
FIG. 10B is a diagram showing an operating state of a sensing circuit in a reset period of FIG. 9.
Figure 10C:
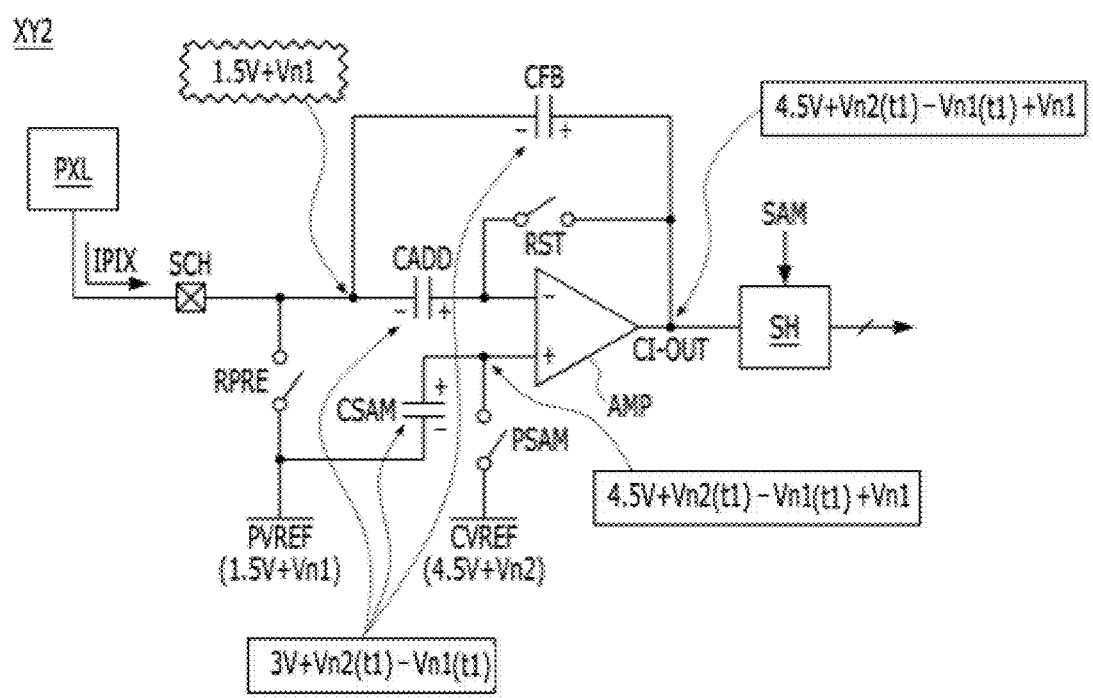
FIG. 10C is a diagram showing an operating state of a sensing circuit in a sensing period of FIG. 9.

FIG. 10A is a diagram showing an operating state of the sensing circuit 22 in the power sampling period XY0 of FIG. 9. FIG. 10B is a diagram showing an operating state of the sensing circuit 22 in the reset period XY1 of FIG. 9. FIG. 10C is a diagram showing an operating state of the sensing circuit 22 in the sensing period XY2 of FIG. 9. In FIGS. 10A to 10C, the pixel reference voltage PVREF is 1.5 V, and the integrator reference voltage CVREF is 4.5 V.

Referring to FIGS. 10A to 10C, the sensing circuit 22 according to another embodiment of the present disclosure may sufficiently secure a current sensing time, but a variation of the voltage SIO of the reference voltage line 150 caused by power noise is small. Here, the power noise may include a first noise voltage Vn1 occurring in the pixel reference voltage PVREF and a second noise voltage Vn2 occurring in the integrator reference voltage CVREF.

In the power sampling period XY0 of FIG. 10A, "1.5V+Vn1" may be applied to a sensing channel terminal SCH and a reference voltage line 150, and "4.5V+Vn2" may be applied to each of a (+) input terminal, a (−) input terminal, and an output terminal of an integrator amplifier AMP. Also, a DC level (i.e., "3V+Vn2−Vn1") of the pixel reference voltage PVREF and the integrator reference voltage CVREF may be sampled and stored in a capacitor CSAM.

In the reset period XY2 of FIG. 10B, "1.5V+Vn1" may be continuously applied to the sensing channel terminal SCH and the reference voltage line 150. At this time, when the switch PSAM is turned off, a voltage of the capacitor CSAM may be "3V+Vn2(t1)−Vn1(t1)", a voltage applied to each of the (+) input terminal, the (−) input terminal, and the output terminal of the integrator amplifier AMP may be changed to "4.5V+Vn2(t1)−Vn1(t1)+Vn1". As a result, "3V+Vn2(t1)−Vn1(t1)" may be stored in each of the capacitor CADD and the capacitor CFB. Here, "Vn1(t1)" is the first noise voltage Vn1 at a time at which the switch PSAM is turned off, and "Vn2(t1)" is the second noise voltage Vn2 at a time at which the switch PSAM is turned off. In the sensing period XY2 of FIG. 10C, a voltage applied to the (+) input terminal and the (−) input terminal of the integrator amplifier AMP may be the same as a voltage stored in each of the capacitors CADD and CFB in the reset period XY1. Therefore, even when the switch RPRE is turned off in this state, a voltage applied to the reference voltage line 150 may maintain "1.5V+Vn1". The variation of the voltage SIO of the reference voltage line 150 may be affected by only the first noise voltage Vn1 and may be irrelevant to the second noise voltage Vn2. The voltage SIO of the reference voltage line 150 and a pixel current may be stabilized in proportion to that an adverse effect of the second noise voltage Vn2 is removed. As a result, the integrator output voltage CI-OUT may be shifted from "4.5V+Vn2(t1)−Vn1 (t1)+Vn1".

In the embodiments of the present disclosure, a display driving operation and a sensing driving operation may be continuously implemented in a state where a reference voltage line maintains the pixel reference voltage PVREF. Therefore, in the embodiments of the present disclosure, in performing the sensing driving operation, a time (a time for changing a voltage to PVREF_CVREF) taken in initializing a voltage of the reference voltage line may be omitted, and a current sensing time may be sufficiently secured in a limited vertical blank period, thereby increasing sensing performance.

Moreover, in the embodiments of the present disclosure, the sensing circuit may further include the switch PSAM and the capacitor CSAM, and thus, the number of noise sources may decrease from two to one. In other words, in the embodiments of the present disclosure, a DC level of the pixel reference voltage and the integrator reference voltage may be sampled by using the capacitor CSAM, and then, only a noise component of the pixel reference voltage PVREF may be sampled in sampling a voltage at both ends of the capacitor CSAM, thereby minimizing the distortion of the integrator output voltage and a voltage variation of the reference voltage line caused by power noise.

The effects according to the present disclosure are not limited to the above examples, and other various effects may be included in the specification.

It will be apparent to those skilled in the art that various modifications and variations can be made in the electroluminescence display apparatus of the present disclosure without departing from the technical idea or scope of the disclosure. Thus, it is intended that the present disclosure cover the modifications and variations of this disclosure provided they come within the scope of the appended claims and their equivalents.

What is claimed is:

1. An electroluminescence display apparatus, comprising:
   a pixel; and
   a sensing circuit supplying a pixel reference voltage to the pixel through a reference voltage line in a display driving operation and sensing a pixel current, flowing in the pixel, through the reference voltage line in a sensing driving operation succeeding the display driving operation,
   wherein the sensing circuit comprises:
      a sensing channel terminal connected to the reference voltage line;
      a first switch connected between the sensing channel terminal and an input terminal for the pixel reference voltage;
      an integrator amplifier including a first input terminal, a second input terminal, and an output terminal;
      an input terminal for an integrator reference voltage connected to the second input terminal of the integrator amplifier;
      a second switch connected between the first input terminal and the output terminal of the integrator amplifier;
      a first capacitor connected between the sensing channel terminal and the first input terminal; and
      a second capacitor connected between the sensing channel terminal and the output terminal of the integrator amplifier,
   wherein the sensing driving operation is performed in a vertical blank period succeeding a vertical active period,
   wherein the vertical blank period comprises a reset period and a sensing period succeeding the reset period, and
   wherein, in the reset period,
      the first switch maintains an on state in the display driving operation,
      the second switch is inverted from an off state to an on state, and an integrator output voltage output through the output terminal of the integrator amplifier is the integrator reference voltage.

2. The electroluminescence display apparatus of claim 1, wherein, in the sensing driving operation, the sensing circuit supplies the pixel reference voltage to the reference voltage line before sensing the pixel current.

3. The electroluminescence display apparatus of claim 1, wherein
the display driving operation is performed in the vertical active period.

4. The electroluminescence display apparatus of claim 3, wherein
the vertical active period is a period where image data is applied to a display panel of the electroluminescence display apparatus so as to reproduce an image, and
the vertical blank period is a period which is disposed between adjacent vertical active periods and where the applying of the image data stops.

5. The electroluminescence display apparatus of claim 1, wherein, in the sensing period,
the first switch and the second switch are inverted from the on state to the off state, and
as the pixel current is accumulated into the second capacitor, an integrator output voltage output through the output terminal of the integrator amplifier is lowered from the integrator reference voltage.

6. An electroluminescence display apparatus, comprising:
a pixel; and
a sensing circuit supplying a pixel reference voltage to the pixel through a reference voltage line in a display driving operation and sensing a pixel current, flowing in the pixel, through the reference voltage line in a sensing driving operation succeeding the display driving operation,
wherein the sensing circuit comprises:
a sensing channel terminal connected to the reference voltage line;
a first switch connected between the sensing channel terminal and an input terminal for the pixel reference voltage;
an integrator amplifier including a first input terminal, a second input terminal. and an output terminal:
an input terminal for an integrator reference voltage connected to the second input terminal of the integrator amplifier;
a second switch connected between the first input terminal and the output terminal of the integrator amplifier;
a first capacitor connected between the sensing channel terminal and the first input terminal:
a second capacitor connected between the sensing channel terminal and the output terminal of the integrator amplifier;
a third switch connected between the second input terminal of the integrator amplifier and the input terminal for the integrator reference voltage; and
a third capacitor connected between the second input terminal of the integrator amplifier and the input terminal for the pixel reference voltage, and
wherein the sensing circuit samples a DC level of the pixel reference voltage and the integrator reference voltage by using the third capacitor, and then, only a noise component of the pixel reference voltage is sampled in sampling a voltage at both ends of the third capacitor.

7. The electroluminescence display apparatus of claim 6, wherein the sensing driving operation is performed in a vertical blank period comprising a power sampling period, a reset period succeeding the power sampling period, and a sensing period succeeding the reset period.

8. The electroluminescence display apparatus of claim 7, wherein, in the power sampling period,
the first switch maintains an on state in the display driving operation,
the second switch and the third switch are inverted from an off state to an on state, and
an integrator output voltage output through the output terminal of the integrator amplifier is the integrator reference voltage.

9. The electroluminescence display apparatus of claim 7, wherein, in the reset period,
the third switch is inverted from an on state to an off state,
the first switch and the second switch maintain an on state, and
an integrator output voltage output through the output terminal of the integrator amplifier is the integrator reference voltage.

10. The electroluminescence display apparatus of claim 7, wherein, in the sensing period,
the third switch maintains an off state,
the first switch and the second switch are inverted from an on state to an off state, and
as the pixel current is accumulated into the second capacitor, an integrator output voltage output through the output terminal of the integrator amplifier is lowered from the integrator reference voltage.

\* \* \* \* \*